(12) United States Patent
Schneider et al.

(10) Patent No.: US 7,612,931 B2
(45) Date of Patent: Nov. 3, 2009

(54) MEMS CONTROL SYSTEM GAIN NORMALIZATION

(75) Inventors: David Schneider, Melbourne, FL (US); Darrel Kanagy, Melbourne, FL (US)

(73) Assignee: JDS Uniphase Corporation, Milpitas, CA (US)

( * ) Notice: Subject to any disclaimer, the term of this patent is extended or adjusted under 35 U.S.C. 154(b) by 168 days.

(21) Appl. No.: 11/437,026

(22) Filed: May 19, 2006

(65) Prior Publication Data

US 2007/0268553 A1    Nov. 22, 2007

(51) Int. Cl.
*G02B 26/00* (2006.01)
(52) U.S. Cl. ...................... 359/290; 359/291
(58) Field of Classification Search ............. 359/290, 359/291
See application file for complete search history.

(56) References Cited

U.S. PATENT DOCUMENTS

| 5,068,864 | A | * | 11/1991 | Javan | 372/32 |
| 5,208,817 | A | * | 5/1993 | Kao et al. | 372/26 |
| 6,700,907 | B2 | | 3/2004 | Schneider et al. | 372/26 |
| 6,711,340 | B2 | | 3/2004 | Dickson | 385/140 |
| 6,995,896 | B2 | | 2/2006 | Yamabana et al. | 359/291 |
| 7,236,680 | B1 | * | 6/2007 | Jordan | 385/147 |
| 2002/0186917 | A1 | | 12/2002 | Kalinowski | 385/18 |
| 2004/0013348 | A1 | | 1/2004 | Dickson | 385/18 |
| 2004/0213515 | A1 | * | 10/2004 | Pezeshki et al. | 385/31 |

OTHER PUBLICATIONS http://products.idsu.com/assets/public/pdf/App_Note_TLM_SW_Control_052404.pdf, "Software Control of the 10 Gb/s Tunable Laser Modulator", JDS Uniphase Corporation.

* cited by examiner

*Primary Examiner*—Jessica T Stultz
*Assistant Examiner*—Mahidere S Sahle
(74) *Attorney, Agent, or Firm*—Pequignot + Myers LLC; Matthew A. Pequignot (57) ABSTRACT

A method and system for providing gain normalization in a MEMS control system and/or device includes moving a MEMS structure from a first position wherein light is redirected from a first input port to an output port to a second position wherein light is redirected from a second input port to the output port, dithering an orientation of the MEMS structure, monitoring an intensity of the dithered light and providing a feedback signal in dependence upon the monitored intensity, and using the feedback signal, determining a control loop gain for active alignment of the MEMS structure. Gain normalization is achieved by applying a fitting function, which is split into a gain control loop gain part and a mechanical part.

13 Claims, 6 Drawing Sheets

MEMS CONTROL SYSTEM GAIN NORMALIZATION

CROSS-REFERENCE TO RELATED APPLICATIONS

Not Applicable.

MICROFICHE APPENDIX

Not Applicable.

TECHNICAL FIELD

The present application relates generally to MEMS, and in particular, to a method and system for providing gain normalization in a MEMS control system and/or MEMS device.

BACKGROUND OF THE INVENTION

Microelectromechanical systems (MEMS) integrate electrical and mechanical components on a single substrate, such as silicon, using microfabrication technologies. Typically, the electrical components are fabricated using integrated circuit processes, while the mechanical components are fabricated using micromachining processes that are compatible with the integrated circuit processes.

MEMS devices are found in an increasing number of applications, from sensor technology, to biomedicine, to telecommunications. Presently, some of the most interesting applications for MEMS devices are optical applications, wherein the tiny mechanical components include mirrors, prisms and/or gratings. For example, in the area of telecommunications, MEMS are used in optical switches, optical modulators, optical attenuators, and optical filters.

In many optical MEMS devices, the MEMS structures are actively aligned using a dithering technique that introduces intentional alignment errors. While this technique has been proven valuable when there is a small range of MEMS orientations, there are more challenges if a wider range of MEMS orientations is required. In particular when the range is relatively wide, the difference in actuation energy for MEMS structures at opposite ends of the range is quite large. This non-linearity, which for example can be caused by electrostatic actuation of MEMS, is translated through the dither into gain distortions that negatively affect the MEMS control system and/or produce undesirable optical distortions (e.g., a perceivable optical dither).

It is an object of the instant invention to provide a method and system for providing gain normalization in a MEMS control system and/or MEMS device.

SUMMARY OF THE INVENTION

The instant invention relates to a method and system wherein non-linearities in MEMS actuation are compensated for. More specifically, it is related to a method and system wherein the control system gain is normalized to compensate for differences in MEMS actuation energy for different orientations of a MEMS structure.

Preferably, the fitting function used to normalize the control system gain is split into two parts, namely a control gain part and a mechanical part. The control gain part provides partial normalization for the control gain, while the mechanical part provides partial normalization by compressing the dither magnitude range. Advantageously, the resulting composite normalization provides an almost unperceivable optical dither magnitude at the output of the MEMS device.

In accordance with one aspect of the instant invention there is provided an optical system comprising: a MEMS structure movable between a first position for redirecting light from a first input port to an output port and a second position for redirecting light from a second input port to the output port, the first input port spatially separated from the second input port; and a MEMS control system for providing a control signal used to actively align the MEMS structure in one of the first and second positions and for providing a dither signal used to modulate the control signal, each of the control signal and the dither signal determined to provide at least partial gain normalization.

In accordance with one aspect of the instant invention there is provided an optical system comprising: a MEMS structure movable between a first position in which light is redirected from a first input port to an output port and a second position in which light is redirected from a second input port to the output port, the first input port spatially separated from the second input port; a MEMS actuator for moving the MEMS structure between the first and second positions, and for dithering an orientation of the MEMS structure about the first and second positions; a detector optically coupled to the output port for monitoring an intensity of the dithered light and for providing a feedback signal in dependence upon the monitored intensity; and a controller for receiving the feedback signal from the detector, for determining a control loop gain used in active alignment of the MEMS structure, for applying a first normalization function to the control loop gain, and for applying a second normalization function to a dither magnitude, wherein the first normalization function is selected in dependence on the second normalization function.

In accordance with another aspect of the instant invention there is provided a method of providing gain normalization in an optical system comprising: moving a MEMS structure from a first position, wherein light is redirected from a first input port to an output port, to a second position, wherein light is redirected from a second input port to the output port, the first input port spatially separated from the second input port; dithering an orientation of the MEMS structure about the second position creating dithered light; monitoring an intensity of the dithered light, and providing a feedback signal in dependence upon the monitored intensity; determining a control loop gain for active alignment of the MEMS structure about the second position using the feedback signal; and applying a first normalization function to the control loop gain and a second normalization function to a dither magnitude, the first normalization function selected in dependence on the second normalization function.

In accordance with another aspect of the instant invention there is provided a method of providing gain normalization in a MEMS control system comprising: actively aligning a MEMS structure using the MEMS control system, the MEMS structure tiltable between a first position for redirecting light from a first port to a second port and a second position for redirecting light from a third port to the second port, the active alignment including providing a dither signal that results in a first dither magnitude at the first position and a second other dither magnitude at the second position, the first and second dither magnitudes providing different control loop gains; and applying a first normalization function to the first and second dither magnitudes and a second normalization function to the different control loop gains.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENTS

Figure 1A:
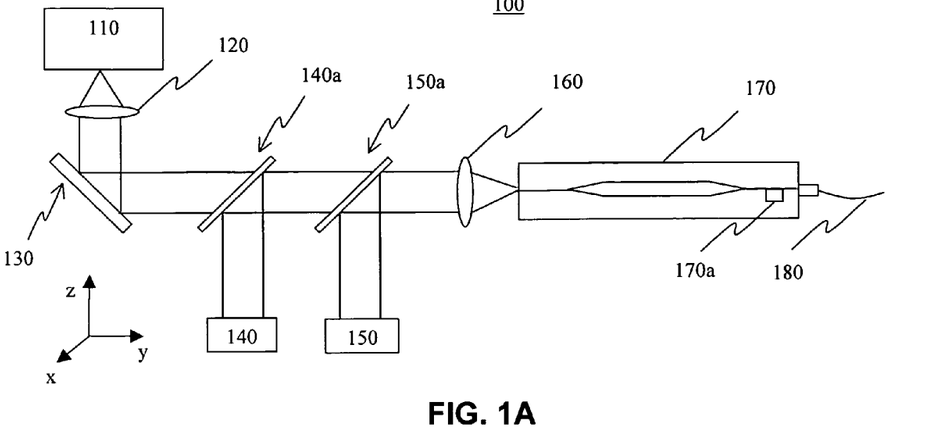
FIG. 1A is a schematic diagram of a TLM.

Referring to FIG. 1 there is shown a schematic diagram of a tunable laser modulator (TLM) for use in fiber optic communication systems. The TLM 100 includes a laser array 110, a first lens 120 for collimating the light transmitted from the laser array 110, a MEMS mirror 130 for deflecting the collimated light, a first beamsplitter or prism 140a for tapping a fraction (e.g., less than 5%) of the deflected light and directing it to a photodetector 140, a second beamsplitter or prism 150a for tapping another fraction (e.g., less than 5%) of the deflected light and directing it to a wavelength detector 150, and a second lens 160 for coupling the deflected light into the optical modulator 170. An optical fiber 180 coupled to the modulator 170 transmits the modulated light to an output of the TLM 100. The optical modulator 170, which for exemplary purposes is illustrated as a Mach-Zehnder modulator, is coupled to a photodetector 170a for monitoring the output optical power. Optionally, an optical isolator (not shown) is placed between the MEMS mirror 130 and the beamsplitters 140a/150a. Notably, the TLM 100 is a hybrid MEMS device wherein the laser array 110, the MEMS 130, and the modulator 170 are all packaged together.

The laser array 110 includes a plurality of continuous wave (CW) lasers, each of which operates at a different lasing wavelength. Some examples of lasers for use in the array include distributed feedback (DFB) lasers, distributed Bragg reflector (DBR) lasers, and vertical cavity surface emitting lasers (VCSELS). For example according to one embodiment, the laser array 110 includes twelve edge emitting DFBs (i.e., stripes) disposed on a semiconductor substrate with a 10 μm spacing between laser facets. Advantageously, the 12-stripe DFB embodiment provides coarse tuning throughout most of the C band when the DFB wavelengths are centered about 1550 nm and separated by approximately 3 nm. A thermoelectric cooler (TEC) (not shown) is optionally coupled to the laser array to control the temperature of the array and thus provide fine tuning of the DFB wavelengths.

The MEMS mirror 130 is a two-axis tilt mirror, which when activated, will tilt about the x and/or y axes to various degrees. Some examples of suitable MEMS actuators include electrostatic, thermal, electromagnetic, and/or piezoelectric actuators. For example, according to one embodiment the MEMS mirror 130 is an electrostatically actuated structure, which in dependence upon an applied voltage provides active alignment about the x and y axes to couple light optimally between the DFB laser array 110 and the modulator 170.

The photodetector 140, which for exemplary purposes is a four quadrant photodiode, provides information pertaining to the angle of the MEMS mirror 130. In particular, it generates photocurrent in each of its four sections that is compared to stored values generated during a calibration procedure. The beam position is thus represented in a Cartesian coordinate system. In some embodiments, the quad detector 140 is also used at the beginning of life (BOL), or the time of manufacture, to determine optimal coupling between the laser array 110 and the modulator 170.

The wavelength detector 150 provides information pertaining to the wavelength of the transmitted light. In many embodiments the wavelength detector is a wavelength locker used to calculate a wavelength error signal from an etalon and one or more photodiodes. For example, according to one embodiment the wavelength detector includes a 100 GHz etalon and a photodiode disposed on a separate temperature controlled platform. The wavelength detector provides feedback used to lock the emission wavelength (e.g., via temperature control using the TEC).

The second lens 160 is used to focus the deflected beam of light into a waveguide of the optical modulator 170. According to one embodiment, the second lens is an aspheric lens that matches the numerical aperture of the optical modulator to the collimated beam of light.

The optical modulator 170 is used to modulate the light with an information signal (e.g., for data transmission). According to one embodiment, the modulator is a 10 Gb/s x-cut $LiNbO_3$ modulator. Of course, the use of other optical modulators is also possible. The output photodetector 170a, which for exemplary purposes is an integrated power monitor photodiode, monitors the optical power at the output of the modulator 170. The measured optical power is used to provide feedback both to the MEMS mirror 130 and to the modulator 170. With regard to the latter, the output is used to control the modulator bias and modulator driver output voltage (for example as described in U.S. Pat. No. 6,700,907, hereby incorporated by reference). With regard to the former, the output is used to control the orientation of the mirror 130.

Figure 1B:
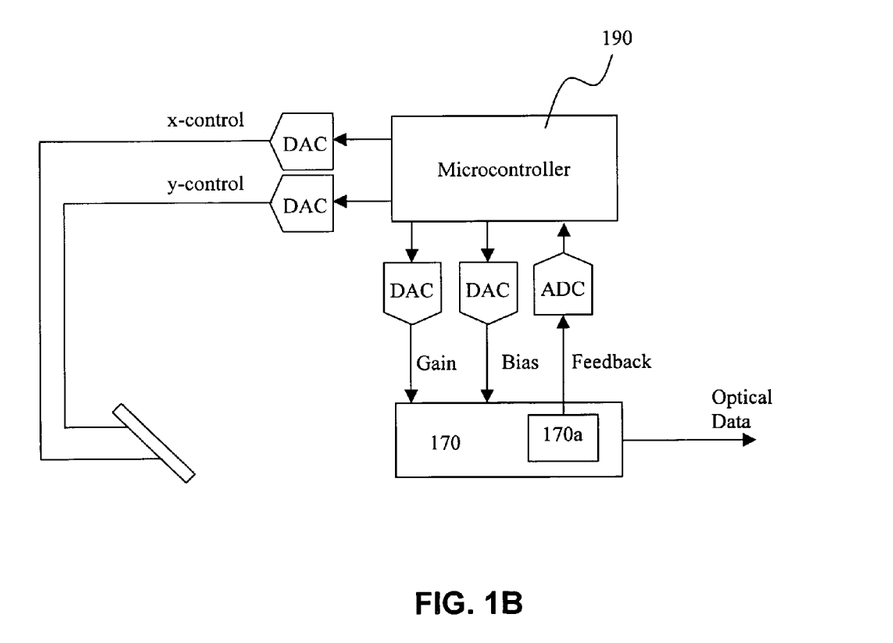
FIG. 1B is a schematic diagram of part of the control system used for controlling the TLM.

With reference to FIG. 1B, analog-to-digital converters (ADCs) are provided for converting photocurrents measured by the photodetectors 140 and 170a into appropriate feedback signals that are transmitted to a microcontroller 190, such as a microprocessor in a digital computer, while digital-to-analog converters (DACs) are provided to convert control signals transmitted from the microcontroller 190 into appropriate drive currents (e.g., that are transmitted to the MEMS driver, modulator driver, and/or laser array).

In operation, a desired wavelength is selected and the laser in the array 110 closest to the desired wavelength is actuated. Fine-tuning, for example via temperature control, is carried out to precisely reach the desired wavelength. The MEMS mirror 130 is first tilted in dependence upon stored parameters to maximize the coupling efficiency between the predetermined laser of the array 110 and the modulator 170. The MEMS mirror 130 is then tilted, in dependence upon the photocurrent measured with the power monitor photodiode 170a, to actively optimize coupling efficiency and to continuously minimize the variation of output power with temperature and time. More specifically, a MEMS control loop gain is adjusted so that the MEMS mirror 130 is tilted such that the optical transmitter 100 operates at the two-dimensional peak of the Gaussian surface corresponding to a plot of output power versus two-dimensional MEMS angle displacement. In practice, this optimization is achieved by tilting the mirror 130 slightly about one of the x and y axes and then tilting the mirror 130 slightly about the other of the x and y axes. This dithering process creates intentional errors in the measured optical power, which provide an indication as to what direction the mirror 130 needs to be tilted in order to reach the peak of the Gaussian surface. Typically, dithering will be performed in a time interleaved fashion (e.g., X for 50 cycles, Y for 50 cycles, X for 50 cycles, etc.), and consequently, the photocurrent produced by the photodiode 170a will be synchronously demodulated with the time interleaved X and Y dithers. In most embodiments the dither displacement angle magnitude will be sufficiently small to ensure that the change in transmitter output power is substantially unperceivable to the transmission system (e.g., resulting in changes less than 0.05 dB).

Referring to FIG. 1B, a schematic diagram of part of the control system for the TLM 100 is shown. More specifically, the four control loops that use feedback from the photodetector 170a are shown. In the first control loop, the feedback signal from the photodetector 170a is sent to the controller 190, which then provides a bias control signal for setting the DC bias level in the modulator 170. In the second control loop, the controller 190 uses the same feedback signal to provide a gain control signal that sets the gain setting for the modulation drive signal. In the third and fourth control loops, which form part of the MEMS control system, the controller uses the feedback signal to provide a MEMS control signal that sets the gain of the MEMS x- and y-controls for maximizing the signal-to-noise ratio (S/N) at the photodetector 170a. The controller 190 also adds a rapidly varying oscillation (i.e., the dither signal) to the relatively slow varying MEMS control signal (e.g., the control signal for x- and/or y-control), to set the total MEMS control system gain.

As illustrated in FIG. 1B, the control system for the TLM 100 is relatively complex. For example, in addition to the photodetector 170a feedback signal being time-shared between the MEMS x- and y-dimensional control systems it must also be time-shared with the modulator bias and modulator driver control systems. One challenge in using such a four-dimensional control system is eliminating inter-loop interference, or cross-talk, arising from the common feedback signal. Another challenge results from the variation in loop gain associated with varying the deflection angle of the MEMS 130.

As discussed above, cross-talk is minimized by providing synchronous detection in the bias, gain, x-, and y-control sub-routines. Furthermore, since each control loop uses the change in photodiode signal (as opposed to the nominal voltage), it is also possible to reduce cross-talk by AC coupling the modulator photodiode feedback signal. In particular, AC coupling the feedback signal allows for increased electrical gain to be applied without DC saturation of the analog operational amplifiers in the converters. This advantageously extends the dynamic range of the control system, and thus removes an additional tuning step in production.

Figure 2A:
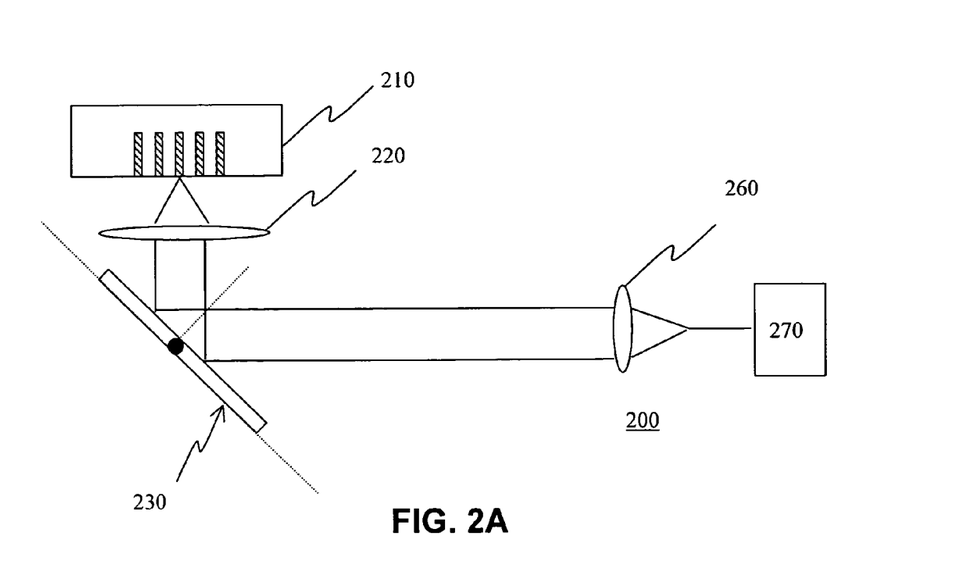
FIG. 2A is a simplified schematic diagram of a TLM wherein the MEMS is coupled to a center laser stripe.
Figure 2B:
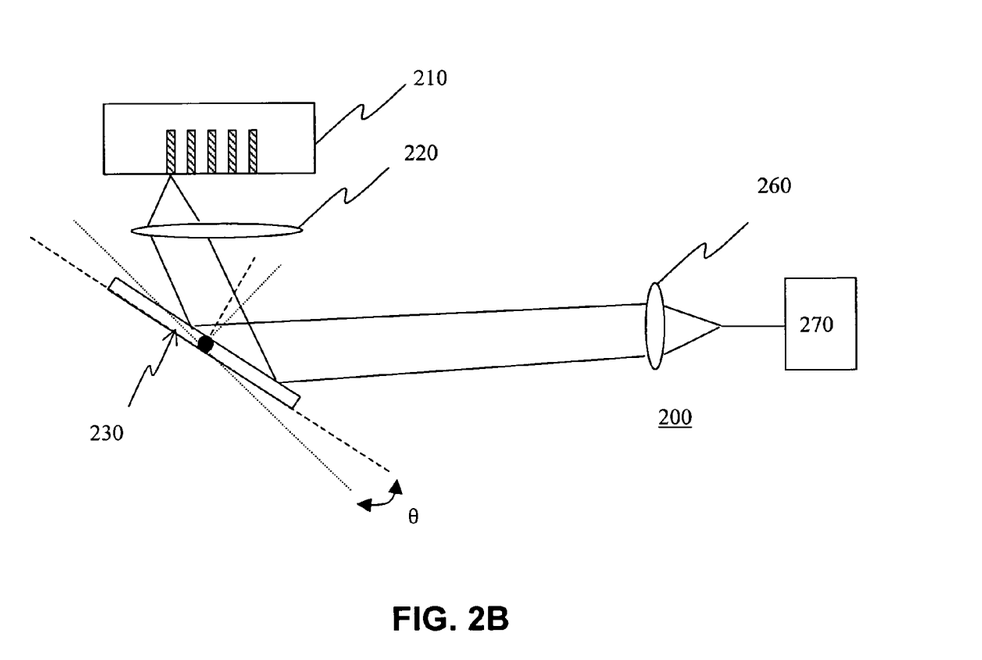
FIG. 2B is a simplified schematic diagram of a TLM wherein the MEMS is coupled to an edge laser stripe.
Figure 3:
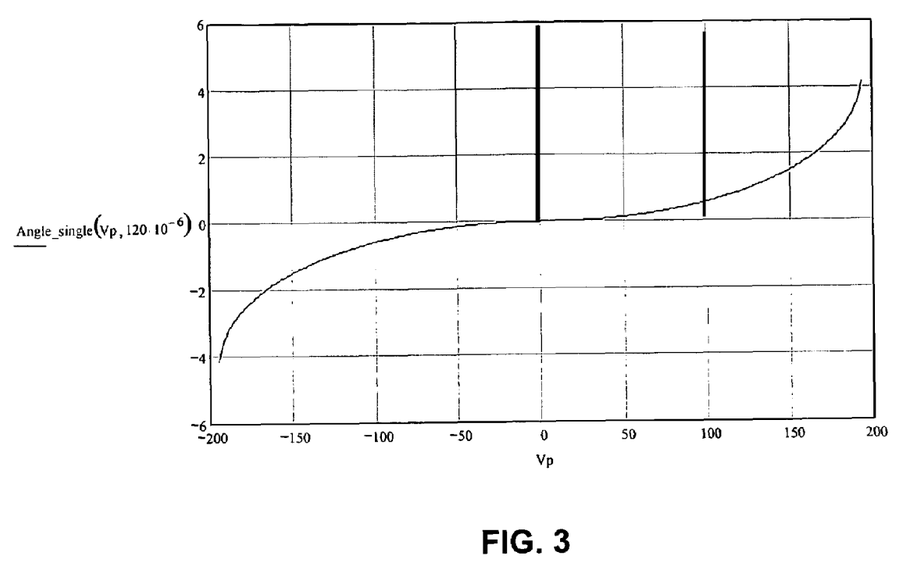
FIG. 3 is a plot of MEMS deflection angle versus applied deflection voltage.

With respect to the latter challenge, consider the simplified system illustrated in FIGS. 2A and 2B. FIGS. 2A and 2B illustrate a TLM 200 having a laser array 210, a first lens 220, an electrostatically driven MEMS mirror 230, a second lens 260, and an optical modulator 270. In FIG. 2A, the MEMS mirror 230 is orientated to couple light from a laser stripe close to the middle of the array 210 to the modulator 270, whereas in FIG. 2B, the MEMS mirror 230 is orientated to couple light from an edge laser stripe of the array 210 to the modulator 270. Notably, a larger voltage is required to provide an edge laser stripe orientation (e.g., for deflection angle θ) than a center stripe orientation (e.g., with an approximately zero deflection angle). In fact, as illustrated in FIG. 3, the relationship between MEMS deflection angle and applied deflection voltage is highly non-linear.

Figure 4:
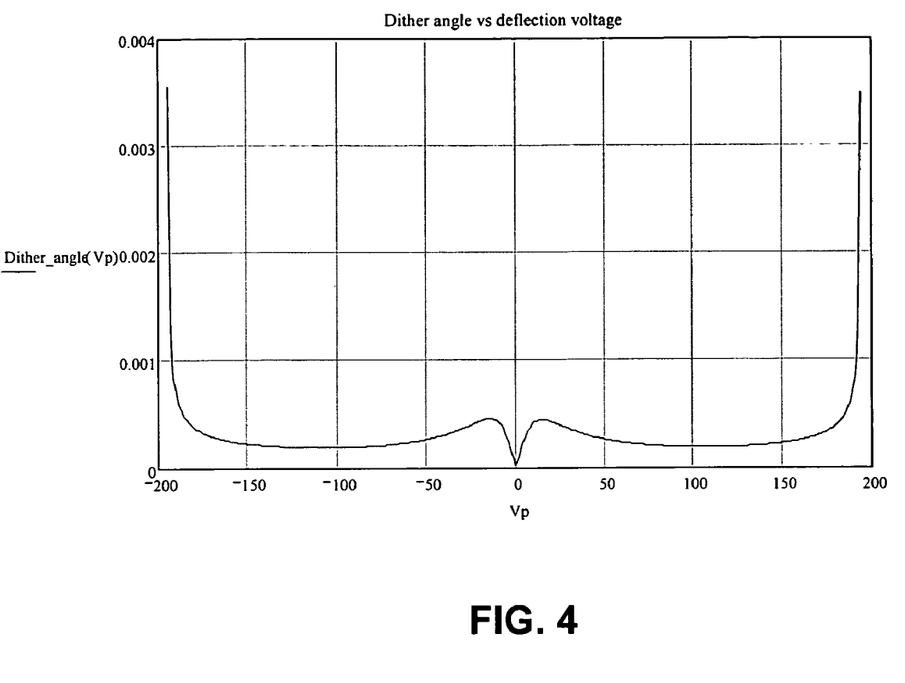
FIG. 4 is a plot of dither angle versus applied deflection voltage.

Furthermore, in addition to the above-described non-linearity in nominal voltage, there is also a non-linearity in the slope of dither angle versus applied deflection voltage. This non-linearity is shown in FIG. 4. The plot illustrated in FIG. 5, which was calculated in dependence upon both FIG. 3 and FIG. 4, demonstrates that for a fixed dither voltage the dither angle will vary with the MEMS deflection angle. In particular, the MEMS mirror 230 will experience larger dither angles when it is orientated to couple an edge laser stripe to the modulator 270 than when it is oriented to couple a laser stripe near the middle of the array to the modulator 270. In general, the dither angle for a center stripe and an edge stripe can be approximately two orders of magnitude different for the same dither voltage.

In an uncompensated system, the fixed dither voltage is typically adjusted such that the maximum dither magnitude (i.e., for the edge laser stripes) corresponds to an unperceivably small change in transmitter optical output power. This, however, results in the center laser stripe feedback signals being approximately two orders of magnitude smaller than the feedback signals corresponding to the edge laser stripes. These weak feedback signals typically exhibit a low S/N, and may even be noisy enough to result in an unlocked, or drifting, MEMS control loop for center stripe optimizations. An unlocked MEMS control loop will produce random MEMS deflection angles and corresponding variations in transmitter optical power. In addition, the variations in magnitude of the feedback signal with stripe location are translated into proportional variations in MEMS control loop gain. These gain distortions (i.e., larger gain constants applied for the center stripes relative the edge stripes) produce a proportional time delay in the control loop convergence for the center stripes relative to the edge stripes.

Figure 5:
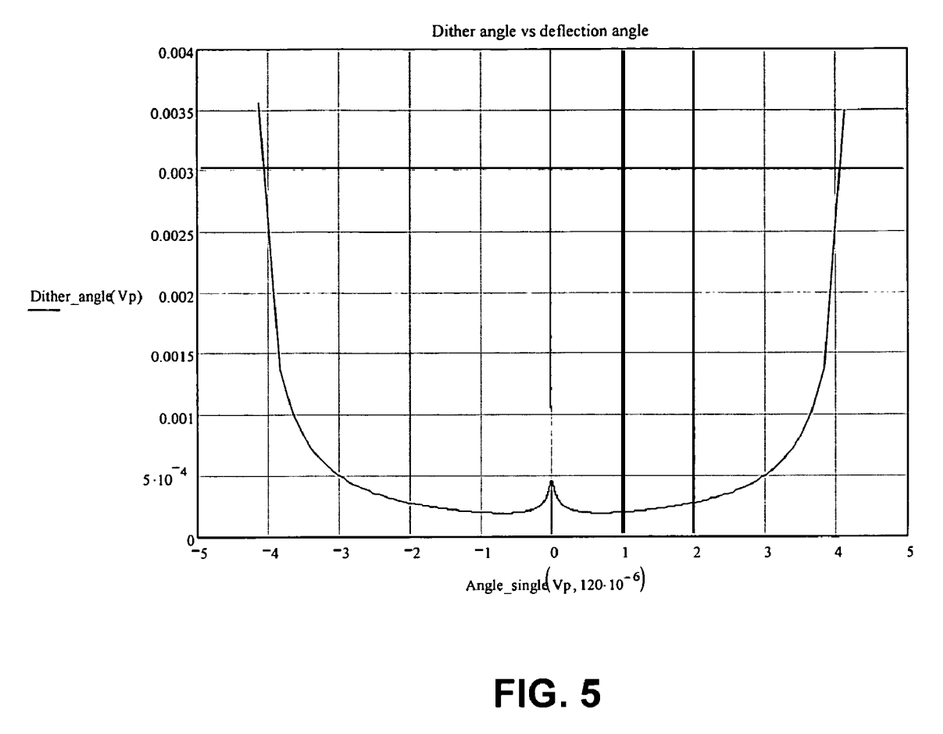
FIG. 5 is a plot of dither angle versus MEMS deflection angle.

To normalize the MEMS control loop gain with deflection angle, one solution is to apply a fitting function to the MEMS dither magnitude to straighten the curve in FIG. 5. In particular, the fitting function is used to increase the dithering voltage for center stripe orientations relative to dithering voltages for edge stripe orientations so that all laser stripes experience a similar and/or same dither magnitude, and hence, loop gain. Unfortunately, the relatively large dithering voltages produced by this mechanical normalization can result in mechanical ringing of the MEMS structure at its natural mechanical resonance frequency, thus also producing unacceptable variations in transmitter optical power.

In accordance with the instant invention, another solution is to apply a fitting function to both the MEMS dither magnitude and to the control loop gain itself. More specifically, the fitting function is split into a mechanical part that is used to increase the dither magnitude (by voltage) and a control loop gain part used to decrease the MEMS control gain constant for active alignment, for center laser stripe orientations relative to edge laser stripe orientations. For example according to one embodiment of the instant invention, a normalization function having a peak corresponding to the square-root of the total control system gain is applied to the MEMS dither magnitude (in voltage) and the same normalization function is also applied as a coefficient to the MEMS control loop gain (i.e., in software).

Advantageously, this approach of using partial control loop gain normalization to supplement partial mechanical normalization drastically reduces the required dither voltages for the center laser stripes, while still providing a good S/N ratio. Moreover, in addition to compressing the dither magnitude variation across all laser stripes, this approach also advantageously results in an overall reduction in dithered optical power observed at the transmitter output.

Figure 6:
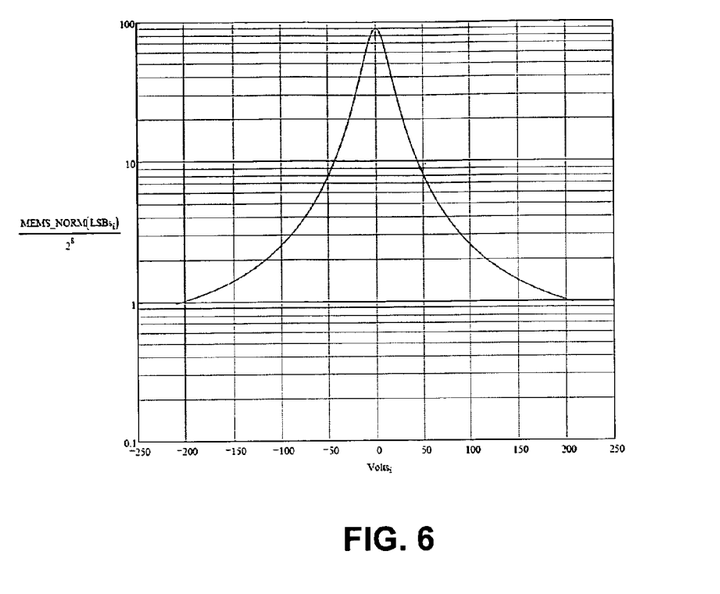
FIG. 6 is a plot of a normalization function in accordance with one embodiment of the instant invention.

Referring to FIG. 6, there is shown a graph of one example of a normalization function for use with the instant embodiment. More specifically, FIG. 6 illustrates a plot of required dither voltage (i.e., in terms of the least significant bit (LSB)) as of function of x-displacement angle (e.g., for each stripe). As discussed above, the curve corresponds to the square-root of total dither compensation (i.e., total control system gain). The normalization function is calculated from:

$$\text{Normalization}(LSBs) = \frac{3,200,000}{(LSBs/200)^2 + 140} + 130.$$

This normalization function has been intentionally simplified to preserve mathematical precision in the fixed-point computation system provided by the micro-controller 190. More specifically, the normalization function has been simplified by limiting the maximum power in the normalization function to a square term. Limiting the maximum power to a square term advantageously obviates the use of high order polynomial (e.g., $x^5$ to $x^7$), which would typically be used to totally flatten the curve shown in FIG. 5. The use of large polynomials in repeated multiplications in a fixed-point system (as opposed to a floating point system) results in a loss of mathematical precision. In addition to preserving mathematical precision, the simplified normalization function also allows for increased processing speeds and smaller digital memory requirements.

Figure 7:
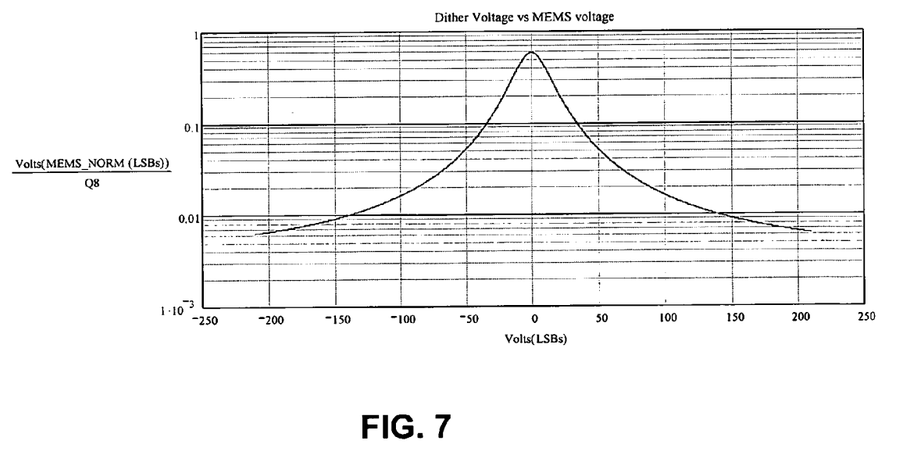
FIG. 7 is a plot of the applied dither voltage versus MEMS deflection voltage.

FIG. 7 demonstrates the effect of the normalization function shown in FIG. 6. More specifically, FIG. 7 shows a plot of applied dither voltage versus MEMS deflection voltage after the normalization function has been applied.

According to another embodiment of the instant invention, two different normalization functions are applied to the MEMS dither magnitude and control loop gain. For example, according to one embodiment, a first normalization function having a peak corresponding to the one half of the square-root of the total control loop gain is applied to the MEMS dither magnitude (in voltage) and a second normalization function having a peak corresponding to twice the square-root of the total loop gain is applied as a coefficient to the MEMS control loop gain (i.e., in software).

In each of the above-described embodiments, the scaled normalization function(s) are determined using that fact that applying the mechanical part and the loop gain part of the fitting function separately has a multiplicative effect. For example, if the plot in FIG. 6 is represented as (Normalize), then the composite total dither compensation will correspond to (Normalize)$^2$. As a result, if there is an average two orders of magnitude difference in MEMS loop gain between a center stripe and an edge stripe (i.e., for the same dither voltage), the instant invention provides compensation for almost four orders of magnitude in gain variation.

Advantageously, this approach of using partial control loop gain normalization to supplement partial mechanical normalization drastically reduces the required dither voltages for the center laser stripes, while still providing a good S/N ratio. Furthermore, in addition to compressing the dither magnitude variation across all laser stripes, this approach also advantageously results in an overall reduction in dithered optical power observed at the transmitter output.

While the variation in loop gain has been discussed with reference to varying the MEMS deflection angle about the x-axis (i.e., for the different laser stripes), it is also possible to discuss it with reference to variations about the y-axis. For example, although the laser array 210 is essentially planar yielding little to no y-coordinate variation between laser stripes, the nominal y-coordinate position, which is defined by the height of the laser array 210 during manufacturing, can vary over a similar angular range as the span of the x-axis stripe distribution. Accordingly, a similar approach is used to normalize the MEMS control loop response time and/or compensate for the manufacturing variance of nominal y-axis angular deflection in the TLM.

Moreover, while the variation in loop gain has been discussed with reference to a TLM, it is also possible to use the instant invention to provide gain normalization for any MEMS device and/or hybrid MEMS device exhibiting gain distortions arising from non-linearity in the device (e.g., non-linearity arising from electrostatic actuation of the MEMS). In particular, the instant invention is suitable for any MEMS device exhibiting a non-linear relationship between MEMS deflection angle and applied deflection voltage that results in variations and/or non-linearity in dithering magnitudes. For example, the instant invention is suitable for use in a MEMS devices forming optical switches, optical attenuators, and/or optical filters.

Of course, the embodiments of the invention described above are intended to be exemplary only. The scope of the invention is therefore intended to be limited solely by the scope of the appended claims.

What is claimed is:

1. An optical system comprising:
   a MEMS structure movable between a first position in which light is redirected from a first input port to an output port and a second position in which light is redirected from a second input port to the output port, the first input port spatially separated from the second input port;
   a MEMS actuator for moving the MEMS structure between the first and second positions, and for dithering an orientation of the MEMS structure about the first and second positions;
   a detector optically coupled to the output port for monitoring an intensity of the dithered light and for providing a feedback signal in dependence upon the monitored intensity; and
   a controller for receiving the feedback signal from the detector, for determining a control loop gain used in active alignment of the MEMS structure, for applying a first normalization function to the control loop gain, and for applying a second normalization function to a dither magnitude,
   wherein the first normalization function is selected in dependence on the second normalization function,
   wherein the first input port transmits light from a first laser in a laser array, and the second input port transmits light from a second laser in the laser array,
   wherein the output port transmits light into an input waveguide of an optical modulator, and wherein the feedback signal is shared between four separate control loops, a first control loop for actively aligning the MEMS structure in a first dimension, a second control loop for actively aligning the MEMS structure in a second other dimension, a third control loop for controlling the bias of the optical modulator, and a fourth control loop for controlling a driver voltage of the optical modulator, the control loop gain corresponding to a gain provided in the first control loop.

2. An optical system according to claim 1, wherein the feedback signal is AC coupled.

3. An optical system according to claim 1, wherein the first and second normalization functions are determined using fixed point calculations.

4. An optical system according to claim 3, wherein the first and second normalization functions are limited to a square term.

5. An optical system according to claim 3, wherein each of the first and second normalization functions is calculated from $$\text{Normalization}\,(LSBs) = \frac{3{,}200{,}000}{(LSBs/200)^2 + 140} + 130.$$

6. An optical system according to claim 1, wherein the MEMS structure is an electrostatically actuated two-axis MEMS mirror.

7. An optical system according to claim 6, wherein the detector is a photodiode integrated with the optical modulator.

8. An optical system according to claim 7, comprising a collimating lens for collimating light transmitted from the laser array to the MEMS minor and a focusing lens for focusing collimated light redirected from the MEMS minor to the input waveguide of the optical modulator.

9. An optical system according to claim 8, comprising a first tap for redirecting a portion of the light redirected from the MEMS mirror to a wavelength detector, and a second tap for redirecting light another portion of the light redirected from the MEMS mirror to a quadrant detector.

10. An optical system according to claim 1, wherein a same dither voltage provides different dither magnitudes for the first and second positions, and wherein the second normalization function is selected to reduce the difference in the dither magnitudes.

11. An optical system according to claim 1, wherein each of the first and second normalization functions is selected to compensate for non-linearity in MEMS actuation, the non-linearity including a non-linear relationship between MEMS deflection angle and applied deflection voltage.

12. An optical system according to claim 1, wherein each of the first and second normalization functions is a curve corresponding to the square-root of total dither compensation.

13. An optical system according to claim 1, wherein each of the first and second normalization functions is selected to provide only partial gain normalization.

* * * * *